United States Patent
Tian

(10) Patent No.: US 8,249,260 B2
(45) Date of Patent: Aug. 21, 2012

(54) METHOD AND APPARATUS FOR AUDIO PATH FILTER TUNING

(75) Inventor: Haijie Tian, Shanghai (CN)

(73) Assignee: QUALCOMM Incorporated, San Diego, CA (US)

(*) Notice: Subject to any disclaimer, the term of this patent is extended or adjusted under 35 U.S.C. 154(b) by 1327 days.

(21) Appl. No.: 11/934,352

(22) Filed: Nov. 2, 2007

(65) Prior Publication Data

US 2008/0292113 A1  Nov. 27, 2008

Related U.S. Application Data

(60) Provisional application No. 60/911,842, filed on Apr. 13, 2007.

(51) Int. Cl.
*H04R 29/00* (2006.01)
*H03G 5/00* (2006.01)

(52) U.S. Cl. .......................... 381/58; 381/98

(58) Field of Classification Search ............ 381/58, 381/56, 57, 98, 99, 100, 59; 455/67.11, 67.14, 455/67.7

See application file for complete search history.

(56) References Cited

U.S. PATENT DOCUMENTS

| | | | | |
|---|---|---|---|---|
| 5,815,580 A * | 9/1998 | Craven et al. | ............ | 381/58 |
| 6,359,987 B1 * | 3/2002 | Tran et al. | ............ | 381/58 |
| 6,639,989 B1 * | 10/2003 | Zacharov et al. | ............ | 381/303 |
| 6,760,451 B1 * | 7/2004 | Craven et al. | ............ | 381/98 |
| 7,158,643 B2 * | 1/2007 | Lavoie et al. | ............ | 381/58 |
| 7,171,005 B2 * | 1/2007 | Lewiner et al. | ............ | 381/77 |
| 7,424,406 B2 * | 9/2008 | Nam | ............ | 702/190 |
| 7,483,540 B2 * | 1/2009 | Rabinowitz et al. | ............ | 381/103 |
| 2006/0271215 A1 * | 11/2006 | Janke et al. | ............ | 700/94 |
| 2007/0025557 A1 * | 2/2007 | Nackvi et al. | ............ | 381/59 |
| 2007/0086597 A1 * | 4/2007 | Kino | ............ | 381/59 |
| 2009/0274312 A1 * | 11/2009 | Howard et al. | ............ | 381/58 |
| 2010/0118921 A1 * | 5/2010 | Abdelmonem et al. | ............ | 375/148 |

* cited by examiner

*Primary Examiner* — Hai Phan
(74) *Attorney, Agent, or Firm* — Kevin T. Cheatham

(57) ABSTRACT

Methods and apparatus for tuning the audio path response of an audio device are described herein. The audio output of an audio device is captured and monitored over a predetermined frequency band. The frequency response of the captured audio output can be compared to one or more predetermined limits defining an acceptable frequency response. One or more dynamically configurable bands can be defined, and one or more parameters affecting the response within each configurable band can be adjusted. A simulated frequency response is produced and filter coefficients for a corresponding filter within the audio path are determined. The filter coefficients can be loaded to a digital filter within the audio path to modify the actual frequency response produced by the audio device.

47 Claims, 9 Drawing Sheets

METHOD AND APPARATUS FOR AUDIO PATH FILTER TUNING

CROSS-REFERENCES TO RELATED APPLICATIONS

This application claims the benefit of U.S. Provisional Application No. 60/911,842, filed Apr. 13, 2007, entitled A METHOD FOR MOBILE PHONE AUDIO PATH FILTER TUNING, hereby incorporated herein by reference in its entirety.

BACKGROUND

It is not uncommon for manufacturers of electronic devices to utilize one or more integrated circuits, sometimes referred to as ICs or chips, or integrated circuit sets, sometimes referred to as chip sets, to support the majority of functions enabled by the device. The oftentimes complicated functions are developed and implemented into the integrated circuits by the IC manufacturers. The design of the electronic device can be greatly simplified through the use of chips or chip sets.

As an example, it is not uncommon for manufacturers of mobile telephones, such as cellular telephones, to base the telephone design on one or more integrated circuits that perform the majority of the telephone functions. A radio transceiver IC can be selected to support a desired air interface standard. Similarly, a baseband processing IC can be selected that operates in conjunction with the radio transceiver IC, and that performs the baseband processing in accordance with a communication standard.

A communication standard may specify performance parameters for the electronic device. The ICs supporting the communication standard may provide the architecture for satisfying the performance parameters. However, the performance of the electronic device typically varies based on the manner in which the ICs are integrated into the final design of the electronic device. Numerous variables may contribute to the performance of the electronic device. The ICs typically include the ability of a designer of the electronic device to modify one or more characteristics within the IC in order to coordinate the performance of the ICs with the electronic device design such that performance parameters of a given standard can be satisfied.

As an example, mobile phone standards bodies, such as the Global Certification Forum (GCF) or the Telecommunications Industry Association (TIA) specify a suite of audio test cases that a mobile telephone should satisfy. Several of the audio test cases relate to a frequency response of a mobile phone's acoustic system.

The acoustic system of a mobile telephone may include the acoustic signal processing modules within an IC, such as a baseband signal processor, as well as filters, amplifiers, and transducers that may be external to ICs. The acoustic behavior of a mobile telephone can be dependent upon many variables that may include, for example, the physical design of the telephone and characteristics of any device within the acoustic system.

Typically, some form of compensation or modification of the audio system is performed in order to design and produce a mobile telephone that is compliant with the relevant communication standards. As an example, a filter can be added to the audio signal path to alter the frequency response exhibited by the entire audio system. The filter can selectively provide emphasis or de-emphasis of one or more audio frequency bands in order to contribute to an audio system that is compliant with the audio test cases of one or more standards.

Typically, filter design and design of a filter having a particular emphasis and de-emphasis response is not a trivial matter. The amount of engineering effort devoted to designing a filter for a particular mobile telephone design may not be trivial and may require several iterations before a suitable filter design is achieved. The complexity and number of iterations contribute to design delays and design costs associated with the design of a mobile telephone.

It is desirable to ease the design process, decrease the number of design iterations, speed the design process, and reduce the design cost associated with the design of a mobile telephone. However, such desires often appear to operate exclusive of one another, and it may not appear possible to satisfy cost reduction while simultaneously speeding the design process.

BRIEF SUMMARY

Methods and apparatus for tuning the audio path response of an audio device are described herein. The audio output of an audio device is captured and monitored over a predetermined frequency band. The frequency response of the captured audio output can be compared to one or more predetermined limits defining an acceptable frequency response. One or more dynamically configurable bands can be defined, and one or more parameters affecting the response within each configurable band can be adjusted. A simulated frequency response is produced and filter coefficients for a corresponding filter within the audio path are determined. The filter coefficients can be loaded to a digital filter within the audio path to modify the actual frequency response produced by the audio device.

Aspects of the invention include an apparatus for filter path tuning in an electronic device. The apparatus includes a signal generator coupled to the electronic device and configured to generate a frequency sweep of a signal processing signal path within the electronic device, a signal sampler configured to sample an output of the signal processing signal path and capture an initial frequency response, a user interface configured to accept a user selection of at least one band within the frequency sweep and variable values within each of the at least one band, a coefficient module configured to determine a value for at least one reconfigurable parameter within the electronic device based on the at least one band and the variable values within each of the at least one band.

Aspects of the invention include an apparatus for filter path tuning in an electronic device. The apparatus includes a signal generator coupled to an input port of a mobile telephone and configured to generate a frequency sweep across at least an audio frequency band, a signal sampler configured to sample an audio signal from the mobile telephone to capture an initial frequency response, a frequency response mask module configured to store data defining at least one predetermined frequency mask, a band control module configured to accept user input defining a plurality of bands within the frequency sweep, a parameter control module configured to accept user input for each of a plurality of variable values within each of the plurality of bands within the frequency sweep, a user interface configured to accept user selection of a frequency mask and user input of the variable values, and a coefficient module configured to determine filter coefficients for a digital filter within an audio signal processing path of the mobile telephone based on the plurality of bands and variable values.

Aspects of the invention include a method of filter path tuning in an electronic device. The method includes capturing a frequency response across a frequency band of the electronic device with the electronic device configured to an initial configuration, determining a selected frequency mask, determining a plurality of bands within the frequency band, receiving a value of at least one variable within each of the plurality of bands, and determining filter coefficients for the electronic device based on the plurality of bands and the value of the at least one variable within each of the plurality of bands.

Aspects of the invention include an apparatus for filter path tuning in an electronic device. The apparatus includes means for sampling a frequency response across a frequency band of the electronic device with the electronic device configured to an initial configuration, means for selecting a frequency mask, means for defining a plurality of bands within the frequency band, means for controlling a parameter of at least one variable within each of the plurality of bands, and means for determining filter coefficients for the electronic device based on the plurality of bands and the value of the at least one variable within each of the plurality of bands.

Aspects of the invention include processor-readable medium comprising instructions, which, when executed by a processor, cause the processor to perform operations. The instructions include instructions for capturing a frequency response across a frequency band of an electronic device with the electronic device configured to an initial configuration, instructions for determining a selected frequency mask, instructions for determining a plurality of bands within the frequency band, instructions for receiving a value of at least one variable within each of the plurality of bands, and instructions for determining filter coefficients for the electronic device based on the plurality of bands and the value of the at least one variable within each of the plurality of bands.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

DETAILED DESCRIPTION OF EMBODIMENTS OF THE INVENTION

Methods and apparatus for automated or semi-automated design and programming of a digital filter placed within the audio signal processing path of an electronic device are described herein. An initial audio frequency response of the electronic device can be characterized using an initial filter configuration. One or more frequency bands can be defined based on the filter characteristics, desired frequency response, or initial audio frequency response.

One or more parameters can be varied within each of the frequency bands in order to modify a design of the digital filter. The coefficients of the digital filter can be updated, recalculated, or otherwise determined based on the modified parameters. One or more simulated frequency responses may be generated in response to modifications of the parameters. The simulated frequency responses can be compared against one or more frequency response masks in order to determine whether the simulated frequency response satisfies a design constraint.

The apparatus can store the filter coefficients corresponding to a simulated frequency response satisfying the design constraint. The apparatus may determine or convert the filter coefficients to a format or protocol used in the implementation of the digital filter. The apparatus can program the digital filter within the electronic device with the stored filter coefficients.

The figures and associated description provided herein focuses on embodiments for modifying a digital filter within an audio signal processing path of an electronic device. However, the invention is not limited to application to audio signal processing nor is the invention limited to determining coefficients for a digital filter. Rather, the embodiments are described to provide a specific example of one potential environment in which the described methods and apparatus may be particularly useful. Additionally, the figures and associated description generally focus on reconfiguring an output audio signal processing path that terminates at a speaker within the electronic device. However, the methods and apparatus described herein are generally applicable to an input audio signal processing path, where the electronic device accepts audio via a microphone or some other audio input device.

Figure 1:
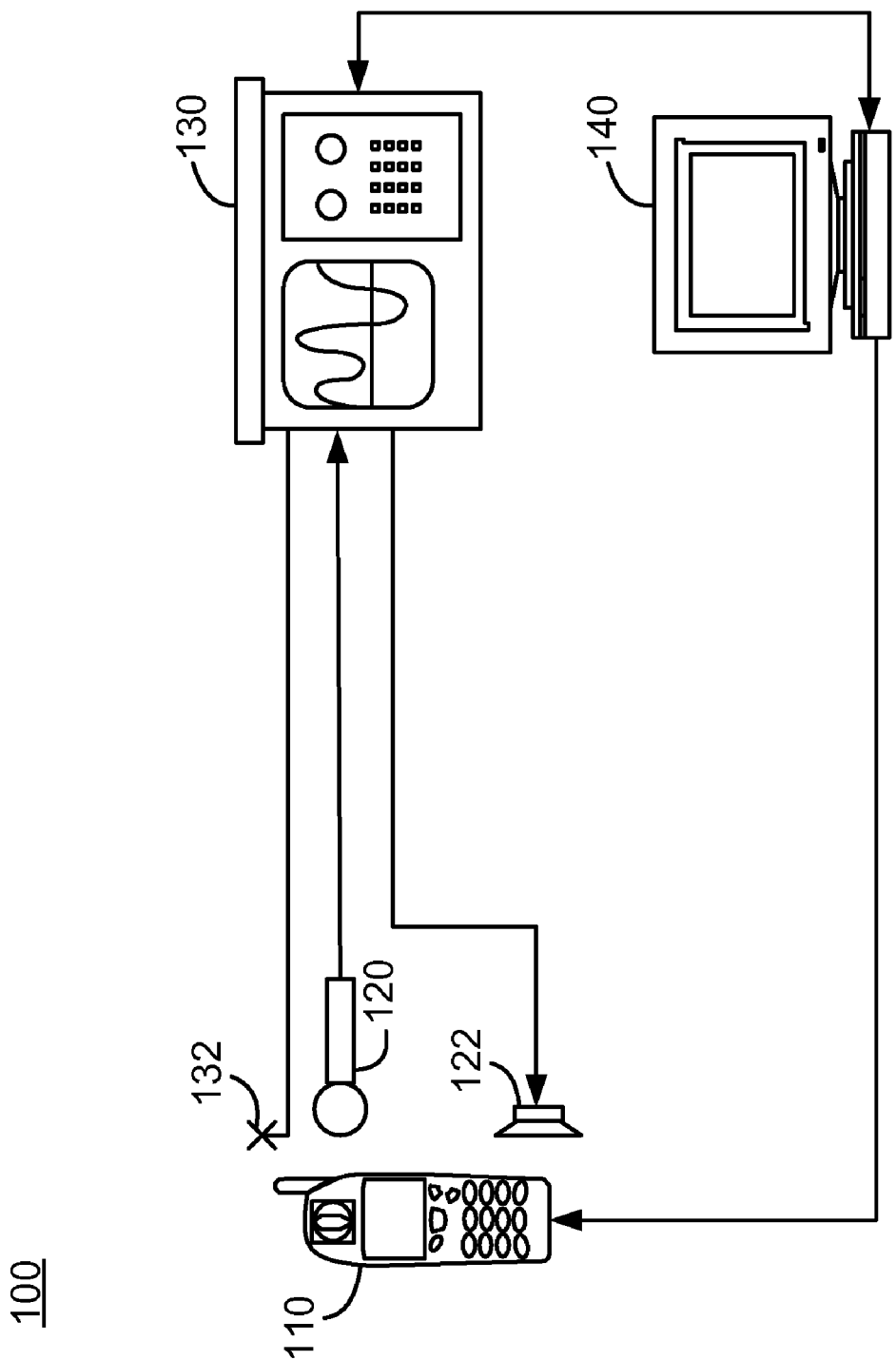
FIG. 1 is a simplified functional block diagram of an embodiment of an audio path filtering system.

FIG. 1 is a simplified functional block diagram of an embodiment of an audio path filtering system 100 having an electronic device 110 in conjunction with audio path monitoring and tuning apparatus. The electronic device 110 can include one or more audio outputs as well as one or more audio inputs. The electronic device 110 can be, for example, a mobile telephone or cellular type telephone.

The audio path monitoring and tuning apparatus can include a microphone 120, a speaker 122, an audio capture module 130, an antenna 132 to provide a wireless interface between the electronic device 110 and the audio capture module 130, and an audio processing and programming module 140. The microphone 120 and speaker 122 can be, for example, adapted to interface with the electronic device 110. For example, the microphone 120 and speaker 122 can be configured within an artificial head that is adapted to recreate a typical interface between the electronic device 110 and a user.

An audio transducer, such as the microphone 120, can be configured to monitor audio output from the electronic device 110. The output from the microphone 120 is coupled to the audio capture module 130, where the audio output from the electronic device 110 can be sampled and stored to memory. In one embodiment, the audio capture module 130 is configured to sample the audio output from the microphone 120, convert it to a digital representation using an Analog to Digital Converter (ADC), and direct the digitized samples to memory (not shown) for further processing.

The audio capture module 130 can include one or more pieces of test equipment that are configured to perform one or more desired audio tests. For example, the audio capture module 130 can include an audio signal analyzer and a communication tester or a base station simulator. The audio capture module 130 can be configured to perform substantially all of the signal generation, interfacing to the electronic device 110, and the audio testing of the electronic device 110.

As an example, an audio analyzer can be configured to perform a predetermined audio test such as an audio test specified in a communications standard. The audio analyzer can be configured to generate an audio sweep and can couple the audio output to the communication tester. The communication tester can be configured to simulate the signal processing performed in a base station. For example, the communication tester may be configured to encode or otherwise compress the audio from the audio analyzer, format the compressed audio according to a predetermined air interface standard, and couple the air interface signal to an antenna 132 that provides the air interface to a corresponding antenna at the electronic device 110.

The audio analyzer can be configured to receive the audio output from the electronic device via the microphone 120, and can perform the predetermined audio test on the received audio. The audio analyzer can sample the audio output from the electronic device 110 and can couple the sampled audio to the audio processing and programming module 140. alternatively, the audio capture module 130 can be configured to store the samples of an audio sweep, and can couple the samples to the audio processing and programming module 140 or otherwise make the samples accessible to the audio processing and programming module 140.

The audio capture module 130 can similarly be configured to perform audio testing of the input audio signal processing path of the electronic device 110. In the example where the audio capture module includes an audio analyzer and a communication tester configured as a base station simulator, the audio analyzer can be configured to generate an audio frequency sweep or some other audio signal and couple the audio signal to the speaker 122. The speaker couples the audio signal to a corresponding microphone or audio input at the electronic device 110. The electronic device 110 processes the audio signal to produce, for example, a reverse link RF signal.

The communication tester can be configured to receive the reverse link RF signal from the electronic device 110 via the antenna 132. The communication tester can perform downconversion, demodulation, and decoding of the reverse link signal to recover the audio. The communication tester can couple the recovered audio to the audio analyzer for performance of the audio test. The audio capture module 130, for example, within the audio analyzer, can sample and store the audio signal. The audio capture module 130 can couple the audio samples to the audio processing and programming module 140 or can provide access to one or more memory locations storing the audio samples.

In another embodiment, the output of the audio capture module 130 is coupled to the audio processing and programming module 140, and the audio processing and programming module 140 operates to coordinate the overall audio processing tasks. The audio processing and programming module 140 includes an output that is coupled to the electronic device 110 and that controls the audio that is output from the electronic device 110. For example, the electronic device can include a test input port, and the processing and programming module 140 can be configured to drive the test input port with the desired audio signal.

In another embodiment, the processing and programming module 140 can be configured to generate a wireless signal in accordance with the air interface of the electronic device 110. The wireless signal can be configured to carry the audio information that is to be output from the electronic device 110. In yet another embodiment, a temporary audio input port can be connected to the audio processing path of the electronic device 110, and the processing and programming module 140 can be configured to drive temporary audio input port. Regardless of the manner in which the processing and programming module 140 communicates the audio information to the electronic device 110, the processing and programming module 140 operates to control the audio output from the electronic device 110.

The processing and programming module 140 can also be coupled to a control input of the electronic device 110. The processing and programming module 140 can be configured to set, modify, or otherwise configure one or more parameters within the electronic device 110 that affect the audio frequency response. The parameters can include, for example, filter responses, amplifier responses, and the like, or some combination thereof. Parameters such as the physical design of the electronic device 110 may also affect the frequency response but may require substantial efforts to modify or reconfigure.

The processing and programming module 140 can modify or otherwise control a filter response within the electronic device 110, for example, by controlling one or more filter coefficients. The processing and programming module 140 can modify or otherwise control an amplifier response, for example, by controlling a current or attenuation setting to an amplifier.

The processing and programming module 140 can be configured to perform or otherwise monitor a frequency sweep across a bandwidth of interest in the audio signal path of the electronic device 110 with the electronic device 110 configured to an initial state or configuration. The samples collected by the audio capture module 130 can then be used to examine an initial frequency response of the audio signal processing path within the electronic device 110.

The processing and programming module 140 can also include one or more predetermined frequency response masks, or can accept one or more user defined frequency response masks. Each frequency response mask represents a desired or specified frequency response. A frequency mask can define, for example, an acceptable passband ripple, a transition band response, as well as an acceptable stopband response. The processing and programming module 140 can compare the initial frequency response of the electronic device 110 against a selected one of the frequency response masks.

If the measured or captured frequency response from the electronic device 110 falls within the frequency mask, the frequency response of the electronic device 110 is acceptable, and the electronic device need not be reconfigured. However, if the captured frequency response falls outside of the desired frequency mask, the processing and programming module 140 can be used to determine the one or more parameters within the electronic device to change, and the updated values.

The processing and programming module 140 can receive or otherwise determine one or more frequency band definitions within the bandwidth encompassed by the frequency response. The processing and programming module 140 can receive or define one or more variables or parameters for each defined band. The processing and programming module 140 can be configured to accept user input for each variable or parameter defined for each of the bands. Alternatively, the processing and programming module 140 can autonomously determine one or more variables or define one or more variables in conjunction with user input.

The processing and programming module 140 uses the one or more variables in the one or more bands to determine an updated electronic device 110 configuration. The processing and programming module 140 can also generate or otherwise determine a simulated frequency response using the updated electronic device configuration. The processing and programming module 140 can compare the simulated frequency response to the selected frequency response mask to determine if the updated electronic device configuration meets the requirements of the selected frequency mask.

The process of modifying the variables in the bands, determining an updated electronic device configuration, determining a simulated frequency response, and comparing the simulated frequency response against the selected frequency mask can be repeated or performed iteratively until a satisfactory result is obtained. The processing and programming module 140 can be configured to determine and store the control parameters to reconfigure the electronic device 110, based on the comparison of the simulated frequency response to the selected frequency mask.

The one or more control parameters can be used to reprogram or otherwise reconfigure the electronic device 110. The frequency response of the reconfigured electronic device 110 can be verified against the simulated response by capturing an updated frequency response.

As an example, the processing and programming module 140 can be configured to determine the filter coefficients for a digital filter within the electronic device 110. The processing and programming module 140 can operate in conjunction with the audio capture module 130 and microphone 120 to capture a frequency response of the electronic device 110 with filter coefficients set to an initial value. For example, the filter coefficients can initially configure the filter as an all-pass filter. The processing and programming module 140 can receive user inputs for band definitions and variable values and can determine a simulated frequency response for selected combinations of bands and variables. For each simulated frequency response, the processing and programming module 140 can determine the corresponding filter coefficients. The values of the filter coefficients can be used to reconfigure the filter within the electronic device 110 once a suitable frequency response is achieved.

The audio capture module 130 may be a stand alone device or may be implemented within or otherwise operate in conjunction with the audio processing and programming module 140 or some combination thereof. For example, the processing and programming module 140 can be a personal computer, and the audio capture module 130 may be a capture card that plugs into the personal computer. Alternatively, the audio capture module 130 may be a stand alone device that can be controlled by the processing and programming module 140. As an example, the processing and programming module 140 can be a personal computer that uses a bus to control an audio analyzer configured as the audio capture module 130. Of course, there are other configurations that can accomplish the same or substantially similar tasks and processes.

Figure 2:
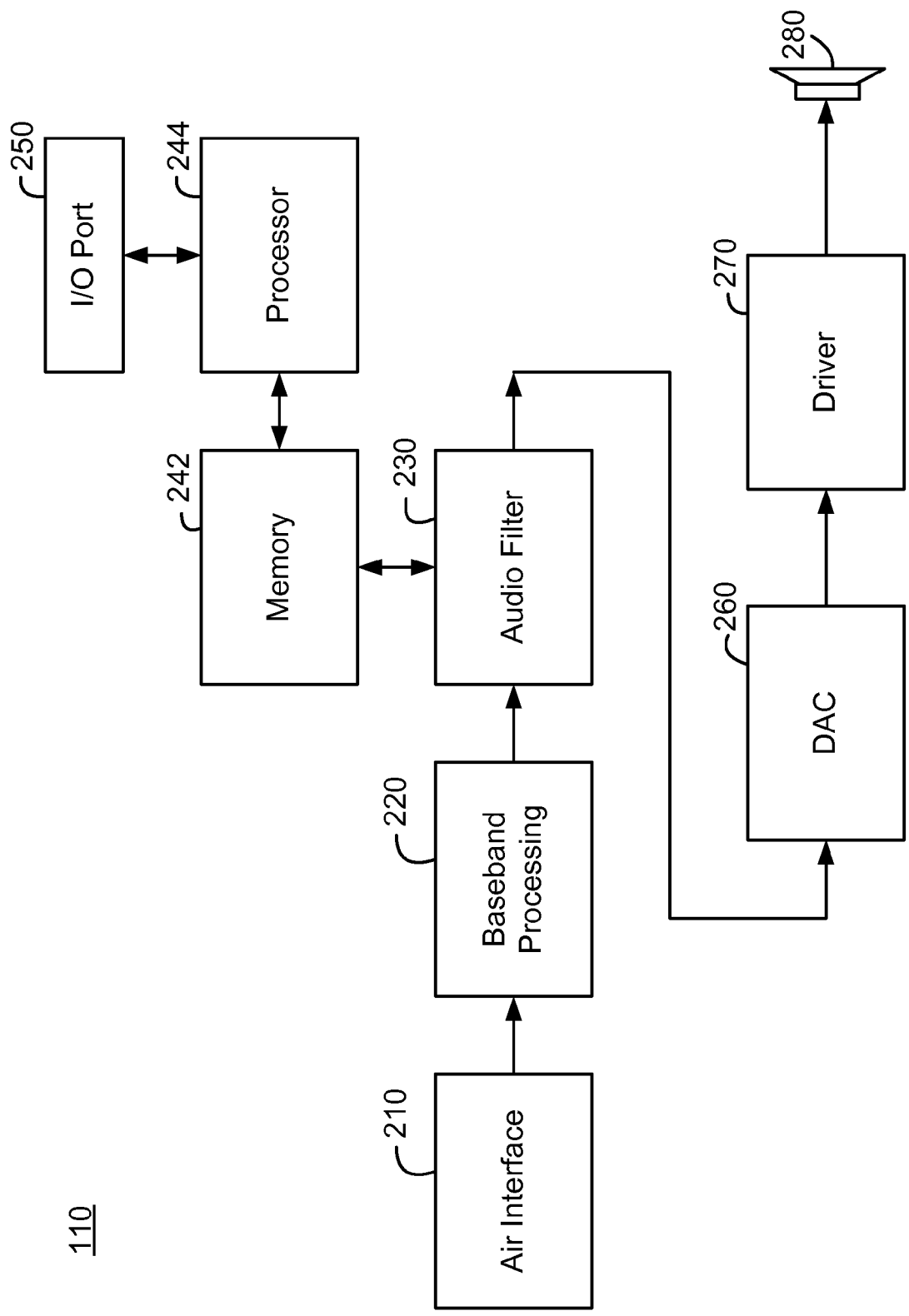
FIG. 2 is a simplified functional block diagram of an embodiment of an electronic device.

FIG. 2 is a simplified functional block diagram of an embodiment of an electronic device 110 that can be an audio device. The electronic device 110 of FIG. 2 can be, for example, the electronic device shown in the system of FIG. 1. The simplified functional block diagram of FIG. 2 is directed to those portions of the electronic device 110 that typically contribute to audio output. Other functional blocks, such as a transmit processing chain and a user interface, have been omitted for the sake of clarity.

The electronic device 110 can be configured as a wireless device, such as a cellular telephone. The electronic device 110 includes an air interface module 210 coupled to a baseband processing module 220. The audio output from the baseband processing module 220 is coupled to an audio filter 230 implemented as a digital filter. The audio filter 230 is coupled to a storage device, such as memory 242 that can store one or more coefficients for the audio filter. A processor 244 can be coupled to the memory 242 and can be configured, for example, to receive the filter coefficients from an I/O port 250 and store the coefficients to locations within memory 244.

The output of the audio filter 230 is coupled to a Digital to Analog Converter (DAC) 260 that operates to convert the digital representation of the audio signal to an analog representation. The output of the DAC 260 is coupled to a driver 270 that can be configured to amplify the audio signal and can also be configured to perform analog filtering of the signal. The output of the driver 270 is coupled to an audio output device, such as a speaker 280. The speaker 280 operates as a transducer to convert the electrical audio signal to a sound pressure level.

The air interface module 210 can be configured to support one or more air interfaces corresponding to one or more wireless communication protocols. For example, the air interface module 210 can be configured to support a Code Division Multiple Access (CDMA), Wideband CDMA (WCDMA), or a Global System for Mobile communication (GSM) wireless air interface, or some other air interface conforming to some other communication standard or some combination of air interfaces.

The air interface module 210 can be implemented in one or more ICs that support one or more air interfaces. Typically, the output of a Radio Frequency (RF) chip or chip set interfaces at baseband frequencies. The baseband processing module 220 can be configured to perform baseband processing in support of one or more communication standards and operates in complement with the air interface module 210.

In one embodiment, the baseband processing module 220 can be configured as a baseband processing IC that operates to support one or more wireless telephone communication standards. The baseband processing module 220 can, for example, couple voice or data signals to the audio signal path.

The audio signal path within the electronic device 110 can also include an audio filter 230. The audio filter can be configured as a digital filter. In one embodiment, the audio filter 230 is placed at or neat a front end of the audio signal path, where the term front end refers to a portion within the audio signal processing path that is prior to a majority of the audio processing modules. Although the audio filter 230 is shown as being distinct from the baseband processing module 220, the audio filter 230 may be integrated within the baseband processing module 220. For example, it may be advantageous to integrate the audio filter 230 into the baseband processing module 220 where the baseband processing module 220 is implemented as a single IC or in a defined chip set.

In one embodiment, the audio filter 230 is configured as a Pulse Code Modulation (PCM) filter that provides audio filtering and that can be reconfigured to compensate for undesired frequency response characteristics of the audio signal path. As an example, the audio filter 230 can be a Finite Impulse Response (FIR) filter, an Infinite Impulse Response (IIR) filter, some other type of digital filter, and the like, or some combination thereof. In a particular embodiment, the audio filter can be configured as a 13-tap FIR filter.

A frequency response of a digital filter can be modified by modifying the filter coefficients. Thus, in the example of a 13-tap FIR filter, up to 13 filter coefficients may be modified. However, in an actual implementation, the FIR filter may utilize symmetric coefficients, such that approximately one-half of the filter coefficients will be substantially the same as another filter coefficient.

The memory 242 can be configured to store the filter coefficients in a non-volatile portion of memory 242. The processor 244 or the baseband processing module 220 can be configured to read the filter coefficients from memory 242, for example, as part of a power-on start-up routine. Thus, the coefficients of the audio filter 230 can be reconfigured in order to modify or calibrate the audio frequency response of the electronic device 110.

Figure 3:
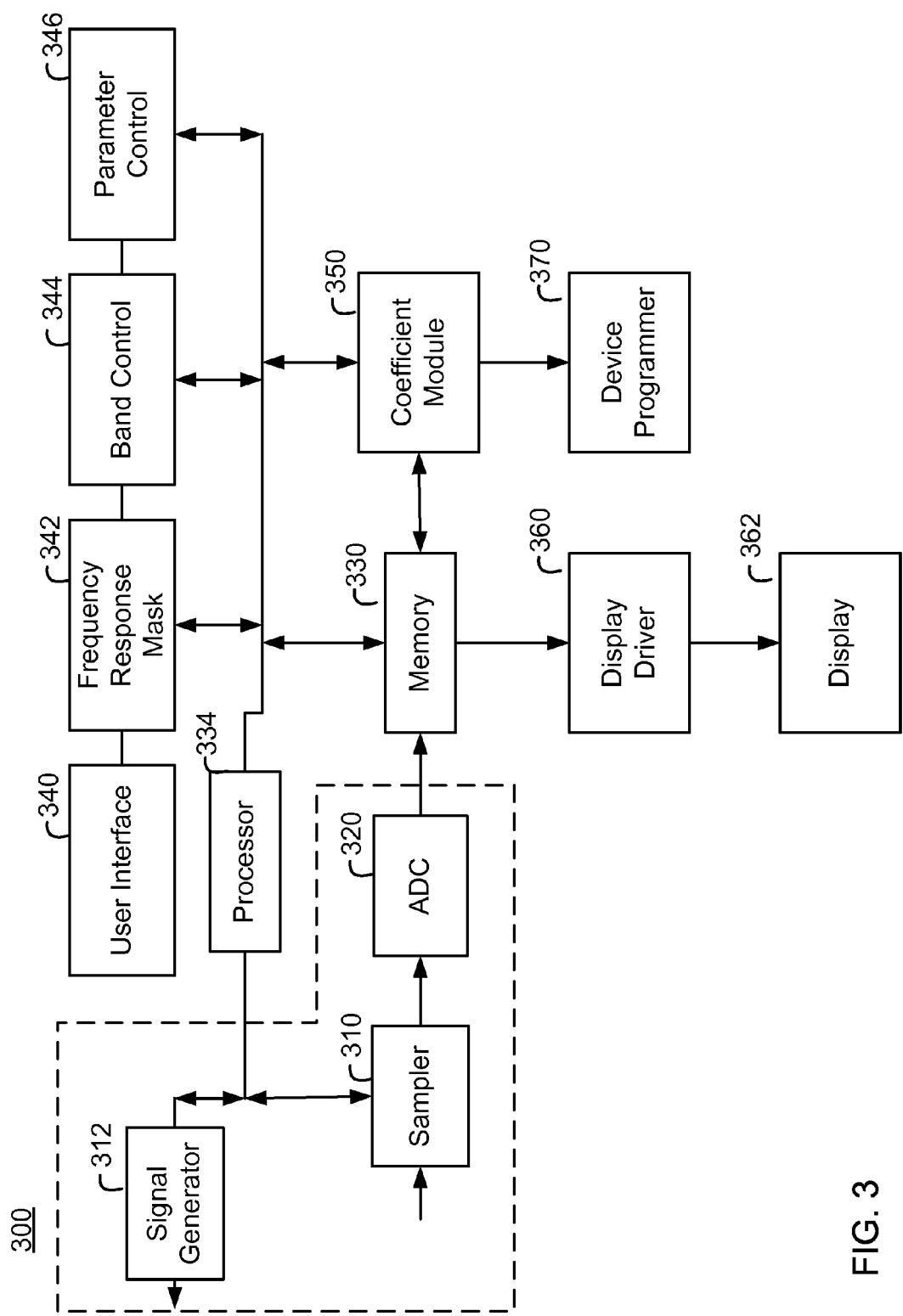
FIG. 3 is a simplified functional block diagram of an embodiment of an audio filter tuning apparatus.

FIG. 3 is a simplified functional block diagram of an embodiment of an audio filter tuning apparatus 300. The audio filter tuning apparatus 300 of FIG. 3 can be implemented within the audio capture module 130 and processing and programming module 140 of the system of FIG. 1. For example, the signal generator 312, sampler 310, analog to digital converter 320, and even portions of memory 330 may be implemented within an audio analyzer of the audio capture module 130. The remaining functional modules may be implemented within the programming module 140.

The audio filter tuning apparatus 300 can include one or more modules configured to generate a frequency sweep in the electronic device and one or more modules configured to capture the audio output from the electronic device for further processing. The audio filter tuning apparatus 300 can be configured to accept one or more user inputs or predetermined variables and can be configured to determine modified parameters, such as filter coefficients, for the electronic device based on the captured frequency response, user inputs, and predetermined variables.

The audio filter tuning apparatus 300 can include a signal generator 312 that is configured to generate a frequency sweep of the audio signal path within the electronic device (not shown). As previously described, the manner in which the signal generator 312 generates a frequency signal depends on the manner in which the audio filter tuning apparatus 300 couples the signal to the electronic device. For example, the signal generator can generate a digital frequency sweep where the signal is coupled to a digital input of the audio signal path of the electronic device. Alternatively, the signal generator 312 can be configured to modulate an RF signal with the desired frequency sweep signal where the signal generator 312 couples the signal to an antenna at the front end of an air interface module within the electronic device. In other embodiments, the signal generator 312 may be configured to generate a frequency sweep signal in some other format or using some other additional processing.

The signal generator 312 is synchronized or otherwise coupled to a signal sampler 310. The sampler 310 is configured to sample the audio output from the electronic device. Typically, the sampler 310 is coupled to an output of a microphone that converts the sound pressure level from the audio output of the electronic device to an electrical signal. In other embodiments, the sampler 310 can be coupled to an electronic audio output of the electronic device. In other embodiments, the microphone or transducer can be integrated within the sampler 310.

The sampler 310 may be configured as a voltage sampler, current sampler, envelope detector, power detector, and the like or some combination thereof. The sampler may be implemented as an envelope detector or power detector if the phase of the audio signal is not monitored. Alternatively, the sampler 310 can be configured as a vector sampler, such as a voltage sampler or current sampler, where knowledge of the phase of the audio signal is desired.

Although it is not a requirement, it is convenient to synchronize the frequency sweep from the signal generator 312 with the capture operation of the sampler 310 such that the captured value can be correlated to a particular frequency. Of course, the synchronization can be, but is to required to be, performed using a communication link between the signal generator 312 and the sampler 310. In other embodiments, a processor 334 that controls the signal generator 312 and sampler 310 can perform the synchronization or can otherwise correlate the frequency to the captured samples.

The ADC 320 can be configured to convert the sampled signal to a digital representation for further processing. The ADC 320 can be configured to couple the digital samples to memory 330. The processor 334 can operate to store the digital samples in memory 330 or the ADC 320 may have the ability to directly access memory 330.

The processor 334 can also be configured to access or control a frequency response mask module 342, a band control module 344, and a parameter control module 346. Each of the frequency response mask module 342, band control module 344, and parameter control module 346 may be configured using a user interface 340. Alternatively, or additionally, each of the modules may have predetermined configurations that can be selected via the user interface 340 or a predetermined algorithm or software stored in memory 330 and accessed by the processor 334.

The frequency response mask module 342 can be configured to store one or more frequency masks that define acceptable limits for an audio frequency response. The frequency response mask module 342 can include one or more pre-defined frequency masks, for example, conforming to frequency masks associated with the audio test cases defined in one or more communication standards. Additionally, the frequency response mask module 342 may permit user defined frequency masks that can be entered, for example, via the user interface 340. The frequency mask information can be stored within the frequency response mask module 342 or may be stored within memory 330.

Each frequency mask typically includes data defining an acceptable passband response, including upper and lower passband frequencies and an acceptable passband ripple. Each frequency mask may also define a transition band response, stopband response, or both transition band and stopband responses.

The band control module 344 can be configured to define one or more bands within the frequency response over which one or more variables can be independently varied. The number of bands and their respective bandwidths may be defined in one or more predetermined band definitions or may be defined based on user input received via the user interface 340. Alternatively, or additionally, the audio filter tuning apparatus 300 may determine the band definitions automatically based on a comparison of the captured frequency response and a selected frequency mask. In one embodiment, the band control module 344 may store or provide access to one or more predetermined band definitions, and permit user defined band definitions as well as automated band definitions. The band definitions may be stored within the band control module 344 or may be stored within memory 330.

The parameter control module 346 can be configured to define the possible parameters or variables that may be varied within each band in order to determine a parameter solution for the electronic device, such that the frequency response of the electronic device satisfies the selected frequency mask. As an example, the parameter control module may define or accept user supplied variables within each band that affect the coefficients of a digital filter implementation. Examples of variables for determining coefficients of a digital filter can include band gain and weighting factor within a particular frequency band. The variable types defined within each frequency band need not be the same. However, it may be convenient to define the same variable types across all band definitions. The parameter control module 346 can accept user input for values of each of the variables or can autonomously vary the variables using a predetermined algorithm. The variable definitions and the corresponding variable values can be stored within the parameter control module 346 or memory 330.

A coefficient module 350 coupled to the memory 330, frequency response mask module 342, band control module 344, and parameter control module 346 can be configured to determine, based on the captured frequency response, definitions, and variable in the associated modules, the one or more parameters to reconfigure within the electronic device. In the embodiment of the audio filter tuning apparatus 300 of FIG. 3, the coefficient module 350 is configured to determine one or more filter coefficients for the digital audio filter within the electronic device. As described earlier, the audio filter tuning apparatus 300 may be configured to determine some other reconfigurable parameter within the electronic device, such as amplifier gains, bias currents, or some other parameters that affect the frequency response.

The coefficient module 350 can determine filter coefficients for each iteration of variables, and can store the results in the coefficient module 350 or in memory 330. The coefficient module 350 or the processor 334 in combination with the filter coefficients determined by the coefficient module 350 can generate a simulated frequency response. The simulated frequency response can be stored in memory 330. The coefficient module 350 can be configured to determine the coefficients and convert the coefficients to a format that is convenient for programming the electronic device. For example, the coefficient module can be configured to determine filter coefficient values and convert the filter coefficient values to a format, such as a hexadecimal format, floating point format, or some other number format that is used by the electronic device.

A display driver 360 can be configured to retrieve the frequency mask, captured frequency response, and one or more simulated frequency responses from memory 330 or the appropriate module and process the data for display by a display 362. In one embodiment, the user can examine the simulated frequency response and compare it against the selected frequency mask to determine if a satisfactory frequency response may be achieved using the filter coefficients. In another embodiment, the processor 334 can compare the simulated frequency response against the selected frequency mask to determine whether the simulated frequency response is acceptable.

The filter coefficients determined by the coefficient module 350 can be coupled to a device programmer 370. The device programmer can be configured, for example, to interface with a control port on the electronic device to write the updated filter coefficients to predetermined locations within the electronic device. In other embodiments, the device programmer 370 is distinct from and external to the audio filter tuning apparatus 300. In such embodiments, a user may electronically or manually transfer the filter coefficients to a device programmer in order to reconfigure the electronic device.

The frequency response of the electronic device may be captured and compared with the selected frequency mask once the electronic device has been reconfigured with the updated filter coefficients. The audio filter tuning process can be repeated if the frequency response is not satisfactory.

Figure 4:
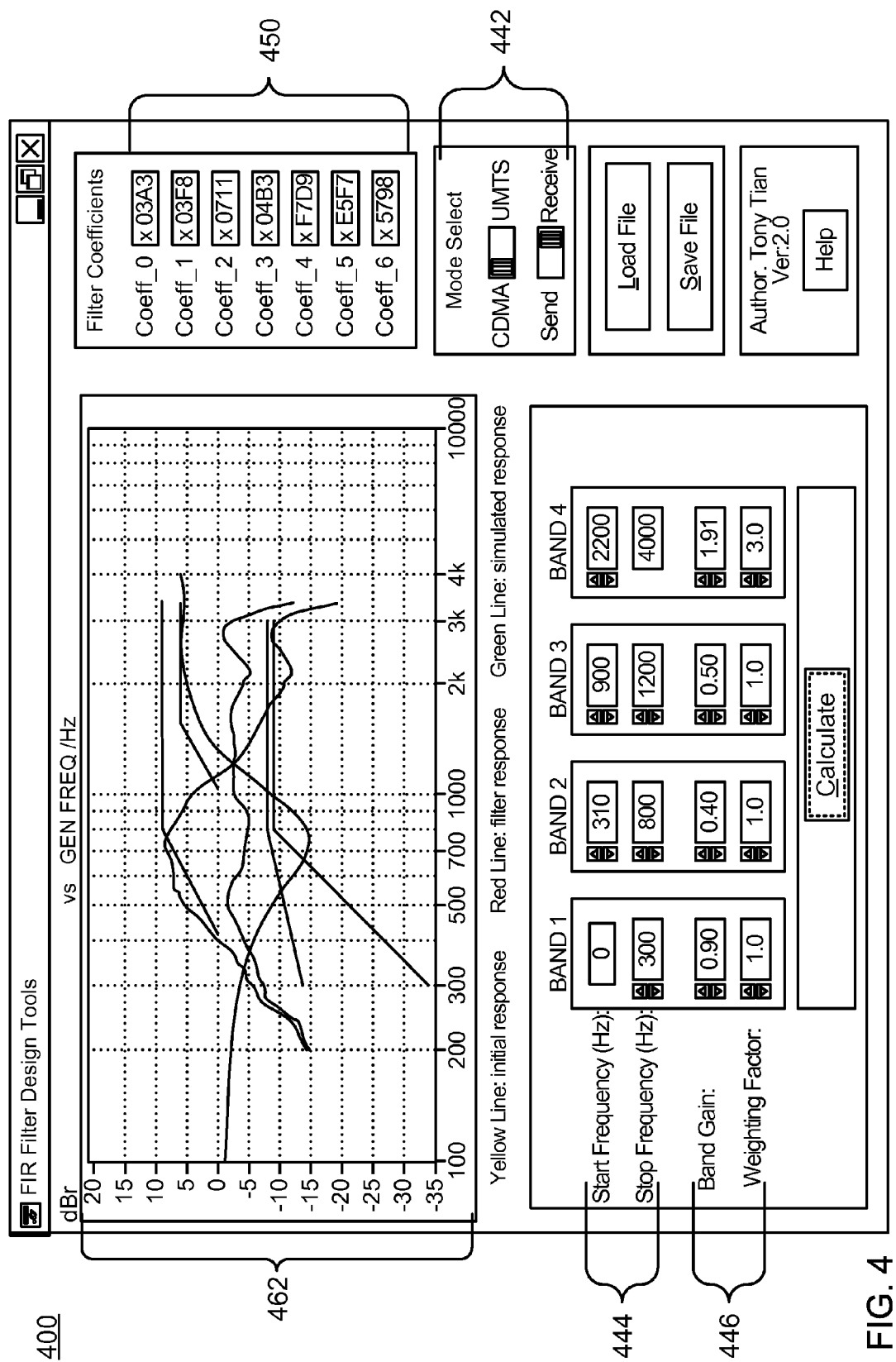
FIG. 4 is a screen image of an embodiment of a graphical user interface for an audio filter tuning apparatus.

FIG. 4 is a screen image of an embodiment of a graphical user interface (GUI) 400 for an audio filter tuning apparatus. The graphical user interface 400 can be part of the audio filter tuning apparatus shown in FIG. 3. The graphical user interface 400 embodiment of FIG. 4 is configured for semi-automated operation, which requires at least some manual user input. Of course, the graphical user interface 400 may be modified if the audio filter tuning apparatus is configured for manual operation or for automated operation.

The GUI 400 includes a display 462 configured to display the captured frequency response, selected frequency mask, and simulated frequency responses. The frequency mask displayed by the GUI 400 can be selected from a predetermined set of frequency masks using the mode selection switch 442. Other embodiments may permit the user to define and store additional frequency masks.

The GUI 400 also includes one or more band definition windows 444 that permit a user to enter start and stop bands for several bands. The GUI 400 displays four distinct bands, but may be configured in other embodiments to permit user definition of the number of bands or may support some other number of bands. The band definitions are depicted as being distinct frequency bands, but in other configurations the frequency band definitions need not be distinct, but may include some overlapping portions.

The GUI 400 also includes a number of predetermined variables 446 within each band. In the embodiment of FIG. 4, the variables are predetermined and include band gain and weighting factor. Each variable is depicted in a window that permits user modification. The range of modification and increment of modification may be predetermined within the GUI 400. For example, the band gain may be varied across a predetermined range, and may be varied in increments of, for example, 0.01. Similarly, the weighting factor may be varied across a predetermined range, and may be varied in increments of, for example, 0.1, whole numbers, or powers of two.

Other embodiments may permit other variables or may permit selection of variables from a list of variables. Yet other embodiments may permit the entry of user defined variables.

The GUI 400 includes a display of filter coefficients 450 that result from the changes in the variables. The GUI 400 can be configured to update the simulated frequency response each time the filter coefficients 450 are updated. The filter coefficients 450 can be displayed in the format used by the electronic device, or can be displayed in some other format, such as a number format that is intuitive to a user.

The GUI 400 permits a user to modify a limited number of variables 446. The user can use the GUI to determine the filter coefficients that correspond to the variables, and can view a display of a simulated frequency response corresponding to the variables. The GUI 400 simplifies the modification or design of the filter within the electronic device to permit a user with a brief understanding of filter design to reconfigure the filter in the electronic device to satisfy a constraint.

As an alternative, the audio filter tuning apparatus can perform substantially automated filter tuning. The audio filter tuning apparatus can capture a frequency response from an electronic device and can receive user input selecting a desired frequency mask. The audio filter tuning apparatus can compare the captured frequency response against the desired frequency mask to define a predetermined number of frequency bands. For example, the desired frequency mask can determine the bands based on a proximity or crossover points of the frequency response relative to the frequency mask.

The audio filter tuning apparatus can then vary each of a predetermined number of variables within each of the bands according to a predetermined algorithm. The algorithm may permit the audio filter tuning apparatus to search a space of possible solutions in order to converge on a solution that satisfies the selected frequency mask. The GUI 400 may permit automated tuning, but may permit manual tuning of the variables to allow for user interaction or to allow for custom solutions where the automated process does not converge to a suitable solution.

Figure 5:
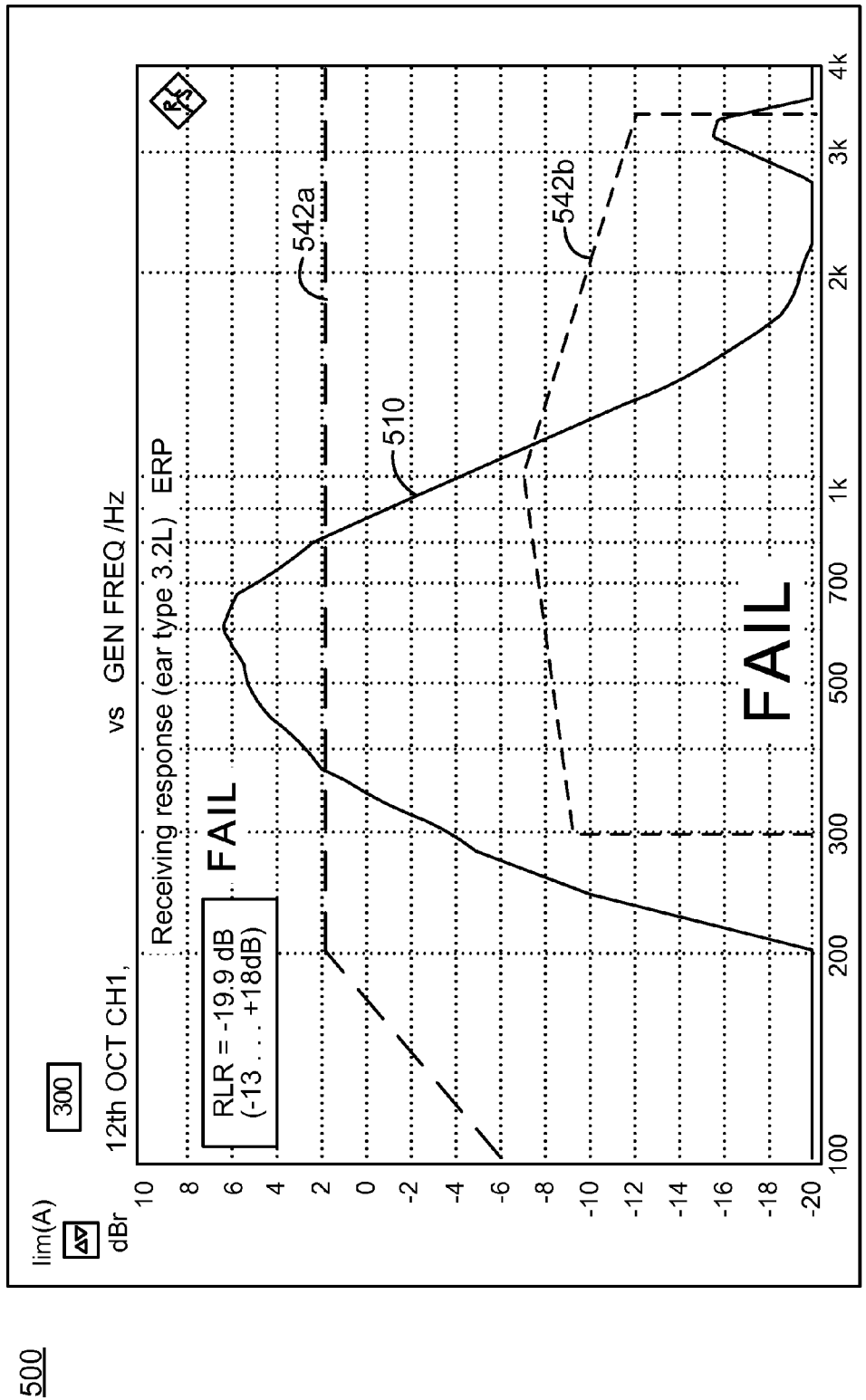
FIG. 5 is an example of an initial frequency response of an audio device.

FIG. 5 is an example of an initial frequency response display 500 of an audio device, such as the electronic device of FIG. 1. The display 500 can be, for example, the GUI display of FIG. 4 or a display implemented within an audio analyzer that is part of the audio capture module of FIG. 1.

The frequency response display 500 illustrates an initial frequency response 510 that can be captured from a frequency sweep of the electronic device using an initial set of frequency coefficients. As an example, the initial set of frequency coefficients can be configured to configure a known frequency response from the filter within the electronic device. The initial frequency response can be, for example, a flat frequency response and can be configured, for example, by setting all of the filter coefficients in an FIR filter initially to zero.

The frequency response display 500 can also display the selected frequency mask, which can include an upper limit 542a and a lower limit 542b for the frequency response. The initial frequency response 510 extends above the upper limit 542a of the frequency mask and below the lower limit 542b of the frequency mask. Thus, the initial frequency response is not compliant with the selected frequency mask.

Figure 6:
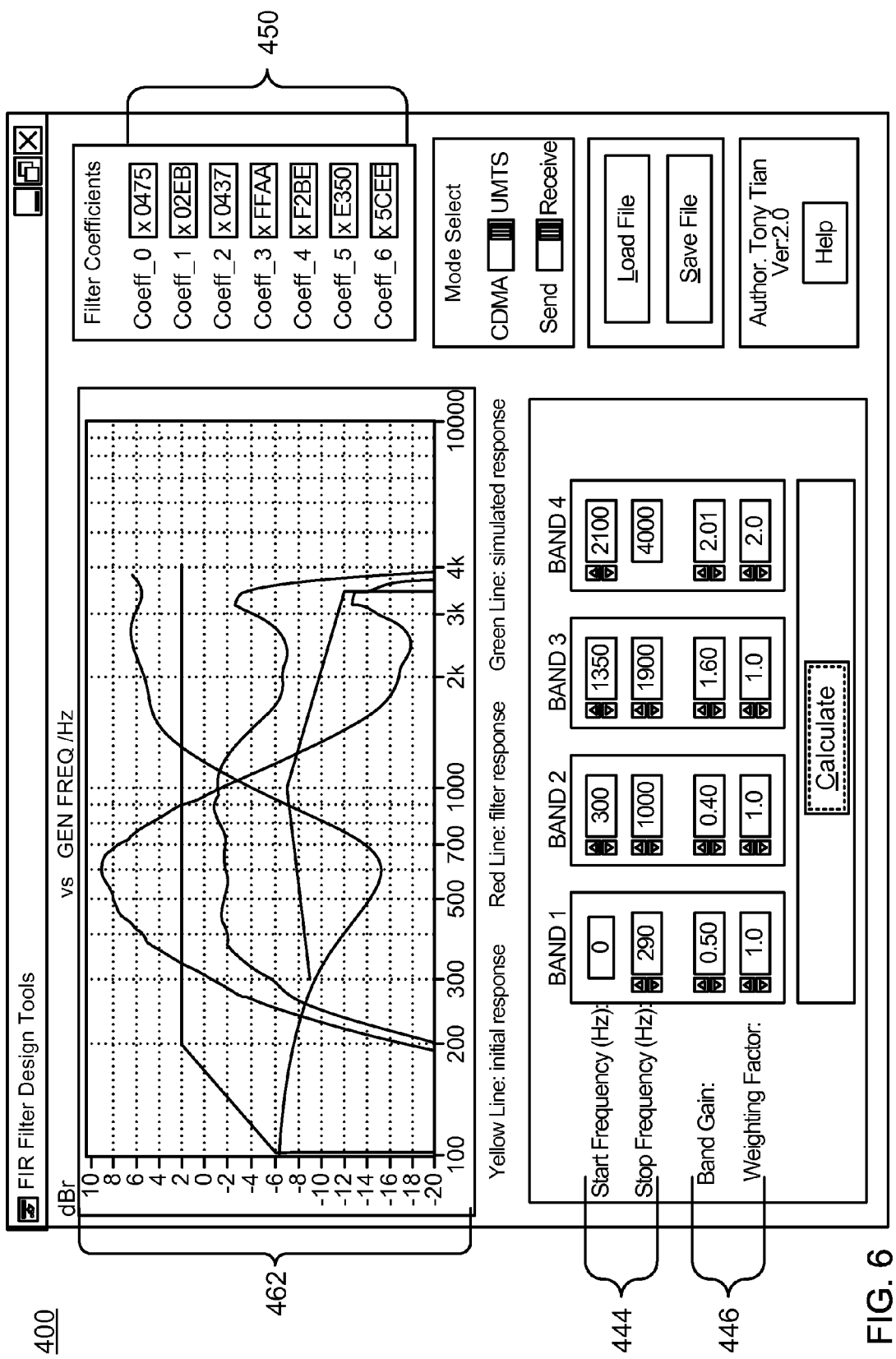
FIG. 6 is a screen image of an embodiment of a graphical user interface for an audio filter tuning apparatus.

FIG. 6 illustrates an example of the GUI 400 display following reconfiguration of the filter coefficients. The display 462 illustrates the selected frequency mask, initial frequency response, and a simulated frequency response. The audio filter tuning apparatus generates the simulated frequency response based on the filter coefficients 450 determined based on the frequency bands 444 and variables 446. In the example of FIG. 6, the simulated frequency response falls within the selected frequency mask. Thus, filter coefficients used to generate the simulated frequency response present good candidates for reconfiguration of the filter in the electronic device. As shown in FIG. 6, the filter coefficients for a 13-tap FIR filter are converted to a number format, here hexadecimal, used by the electronic device. In one embodiment, the audio filter tuning apparatus can be configured to directly write the filter coefficients to memory or otherwise reconfigure the FIR filter in the electronic device to use the filter coefficients.

Figure 7:
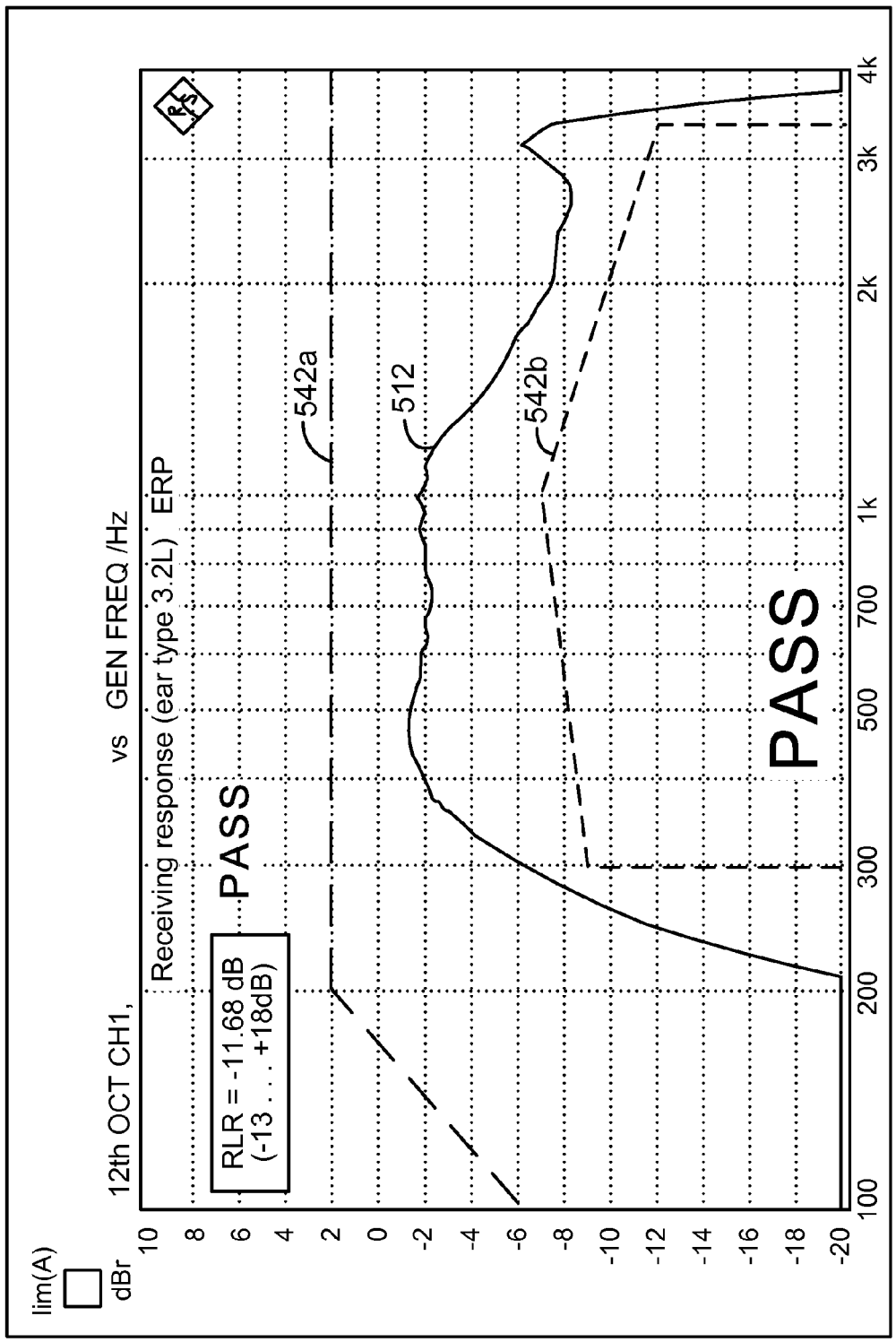
FIG. 7 is an example of a frequency response after programming of coefficients.

FIG. 7 illustrates an example of a frequency response display 500 that illustrates a captured frequency response 512 following reconfiguration of the FIR filter within the electronic device. The display 500 can be, for example, the GUI display of FIG. 4 or a display implemented within an audio analyzer that is part of the audio capture module of FIG. 1. The captured frequency response 512 falls within the upper limit 542a and lower limit 542b of the selected frequency mask. The captured frequency response 512 closely tracks the simulated frequency response illustrated in the GUI display of FIG. 6, and thus demonstrates a close correspondence between the simulated frequency response and the measured frequency response from the electronic device following reconfiguration.

Figure 8:
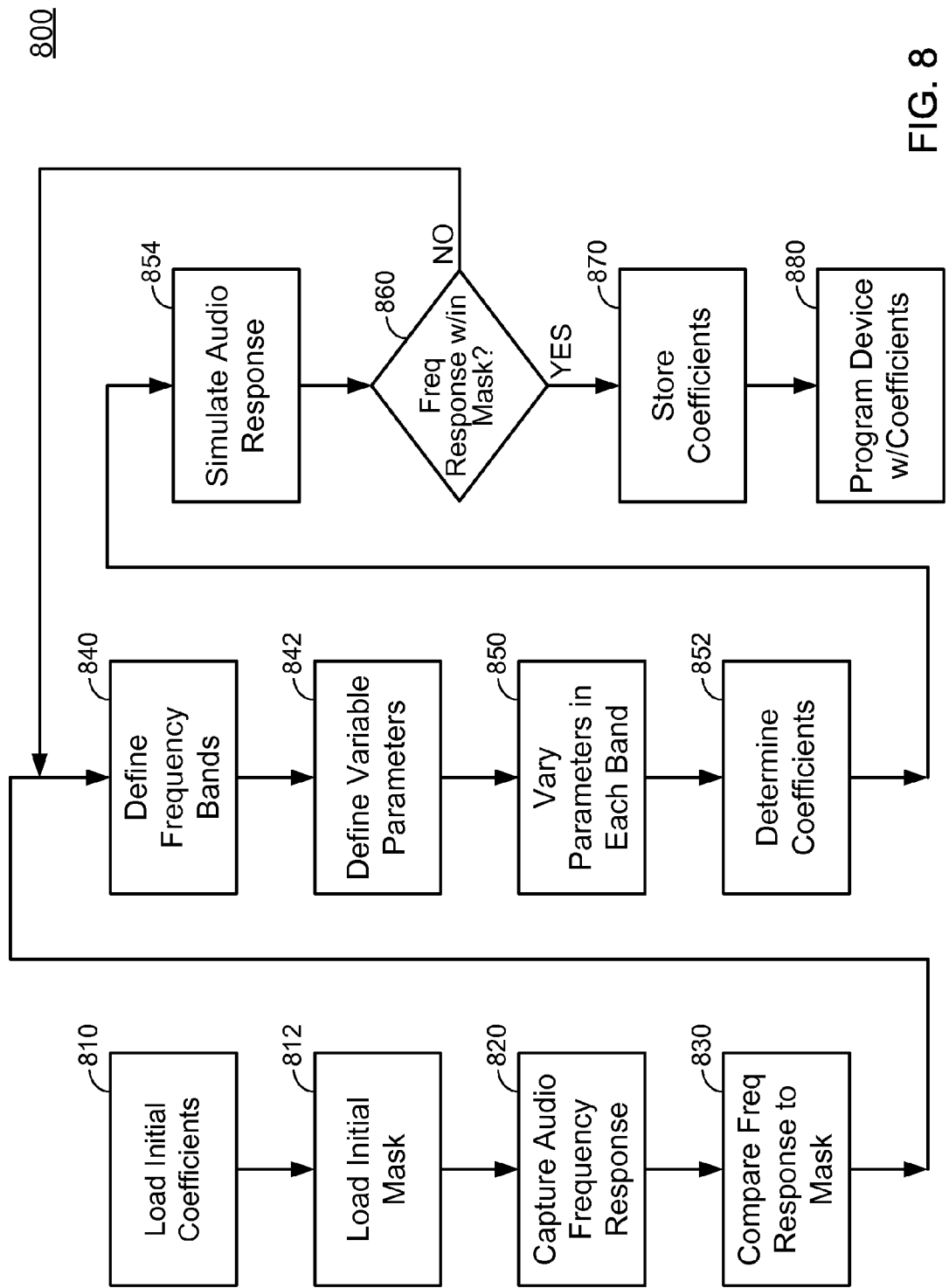
FIG. 8 is a simplified flowchart of an embodiment of a method of configuring a filter.

FIG. 8 is a simplified flowchart of an embodiment of a method 800 of configuring a filter. The method can be performed, for example, by the audio filter tuning apparatus of FIG. 1 or FIG. 3 to tune or otherwise reconfigure a digital filter in an electronic device.

The method 800 begins at block 800 where the audio filter tuning apparatus loads or otherwise configures the filter in the electronic device with initial coefficients. The initial filter coefficients can be, for example all zeros, or some other predetermined set of filter coefficients corresponding to a predetermined frequency response. The task of loading the initial filter coefficients may optionally be performed by an apparatus other than the audio filter tuning apparatus. For example, the manufacturer of the electronic device can initially configure to the electronic device with the initial filter coefficients. In another embodiment, some other programming apparatus can load the initial filter coefficients into the electronic device.

The audio filter tuning apparatus proceeds to block 812 and loads an initial or selected frequency mask. The selected frequency mask can be determined based on user selection from one or more predetermined frequency masks, or can be determined based on user input defining a frequency mask.

The audio filter tuning apparatus proceeds to block 820 and captures a frequency response, such as an audio frequency response, from the electronic device. The audio filter tuning apparatus can be configured to generate a frequency sweep and sample an output from the electronic device at different frequencies during the frequency sweep to characterize the frequency response with the electronic device configured with the initial filter coefficients.

An audio frequency response can be measured over a frequency range that spans, for example, 20 Hz to 20,000 Hz. Of course the frequency response is not limited to an audio frequency response, and the frequency span is not limited to 20 Hz to 20,000 Hz. A frequency sweep and corresponding captured frequency response may extend beyond frequencies normally considered to be audio, such as in the case where the electronic device supports some type of data communication. The frequency sweep can be a frequency sweep of a receive audio signal processing path of the electronic device, which terminates at a speaker within the electronic device. Alternatively, the frequency sweep can be a frequency sweep of a transmit audio signal processing path of the electronic device, which originates at a microphone of the electronic device. In other embodiments, the frequency sweep can be a sweep of only portions of a receive or a transmit audio signal processing path.

The audio filter tuning apparatus proceeds to block 830 and compares the initial frequency response captured from the electronic device with the selected frequency mask. In one embodiment, the audio filter tuning apparatus performs the comparison electronically and automatically. In another embodiment, the audio filter tuning apparatus displays the selected frequency mask and the initial frequency response, and permits the user to perform the comparison.

The audio filter tuning apparatus proceeds to block 840 and defines one or more frequency bands or receives the definitions for one or more frequency bands based on the comparison. The audio filter tuning apparatus may include a predetermined number of frequency bands, and this operation may be omitted in some embodiments. In embodiments in which the audio filter tuning apparatus performs the comparison between the captured frequency response and the selected frequency mask, the audio filter tuning apparatus may autonomously define the frequency bands. In other embodiments, the audio filter tuning apparatus may accept user band definitions via a user interface. In yet other embodiments, the audio filter tuning apparatus may permit band definition using a combination of one or more predetermined, autonomously determined, or user defined bands.

The variables can be defined to be related to the reconfigurable parameters within the electronic device. For example, where the audio filter tuning apparatus is configured to determine updated filter coefficients for a FIR or an IIR filter in the audio signal processing path, the variables can be selected to be a band gain and a weighting factor.

After determining which of variables to include within each band, the audio filter tuning apparatus proceeds to block 850 and varies the variables or parameters in each band. The audio filter tuning apparatus may tune the variables according to a predetermined algorithm or process, or may permit user entry or modification of the variables via a user interface.

The audio filter tuning apparatus proceeds to block 852 and determines new or updated filter coefficients based on the values for the variables input by the user or adjusted by the audio filter tuning apparatus. The audio filter tuning apparatus proceeds to block 854 and simulates the frequency response with the updated filter coefficients.

The audio filter tuning apparatus proceeds to decision block 860 and determines if the simulated frequency response falls within the selected frequency mask. The comparison may be performed automatically by the audio filter tuning apparatus or may be performed manually by the user of the audio filter tuning apparatus. In the example of manual comparison, the audio filter tuning apparatus may receive some user input that indicates compliance or otherwise indicates a satisfactory simulated frequency response.

If the simulated frequency response is not satisfactory, the audio filter tuning apparatus returns to block 850 to permit further adjustment of the variables within each defined band. Optionally, the audio filter tuning apparatus may return to block 840 to permit new band and variable definitions.

If the simulated frequency response is satisfactory, the audio filter tuning apparatus proceeds from decision block 860 to block 870 and stores the updated coefficients in memory, such as in a file location defined by the user. Alternatively or additionally, the audio filter tuning apparatus can write the updated coefficient values to one or more memory locations within a storage device of a device programmer.

The audio filter tuning apparatus proceeds to block 880 and programs the electronic device with the updated filter coefficients. In some embodiments, programming of the electronic device is performed using a programmer that is distinct from the audio filter tuning apparatus. in such embodiments, the updated filter coefficients can be transferred from the audio filter tuning apparatus to the device programmer for programming of the filter coefficients.

Figure 9:
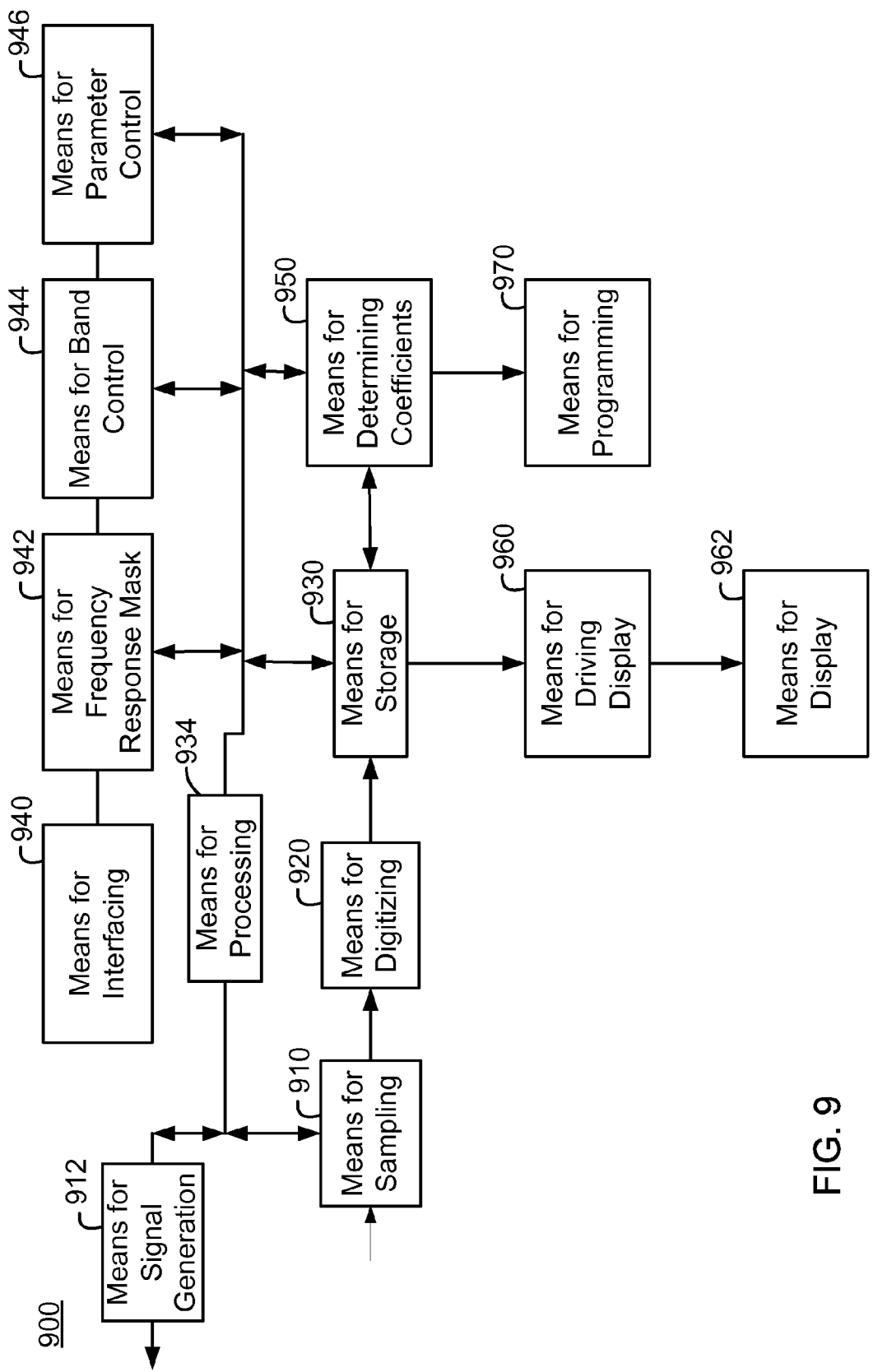
FIG. 9 is a simplified functional block diagram of an embodiment of an audio filter tuning apparatus.

FIG. 9 is a simplified functional block diagram of an embodiment of an audio filter tuning apparatus 900. The audio filter tuning apparatus 900 can be, for example, the audio tuning apparatus in the system of FIG. 1. The audio filter tuning apparatus 900 is depicted as a embodiment that determines the filter coefficients for a digital filter within the electronic device.

The audio filter tuning apparatus 900 includes a means for signal generation 912 configured to generate signals used to perform a frequency sweep of the audio signal processing path of the electronic device. The means for signal generation 910 is coupled or otherwise synchronized to a means for sampling 910 configured to sample an audio signal from the electronic device.

The means for sampling 910 couples the captured signal samples to a means for digitizing 920 that converts the signal samples to a digital representation. The means for digitizing 920 couples the digitized samples to a means for storage 930 to permit further processing of the samples.

A means for interfacing 940 can be configured as an electronic interface or a user interface. The means for interfacing 940 can be configured, for example, to accept user input or definitions of frequency masks, band information, and parameters that are used by the audio filter tuning apparatus 900 to determine updated filter coefficients.

Frequency mask information can be stored or otherwise entered via the means for interfacing 940 to a means for frequency response mask 942. The means for frequency response mask 942 can be configured, for example, to store one or more predetermined frequency masks corresponding to predetermine audio test cases that are defined in operating standards.

The means for band control 944 can be configured to store or otherwise receive via the means for interfacing 940 band definition information. The band definition is used to define different bands over which parameters or variables may be adjusted in order to determine updated filter coefficients and updated frequency response.

The means for parameter control 946 stores or otherwise receives via the means for interfacing 940 the definitions of the variables or parameters, as well as values of the variables and parameters that can be adjusted to compensate a frequency response from the electronic device.

A means for determining coefficients 950 can access the band control information and variable values and determine and updated filter coefficients satisfying the variables. A user can further modify the band control and variable parameters to generate another iteration of the filter coefficients. The means for determining coefficients 950 can couple the filter coefficients to a means for programming 970 that is configured to program the electronic device with the updated filter coefficients.

The audio filter tuning apparatus 900 can provide visual output to facilitate the user experience. The various captured frequency samples, selected frequency mask, band definitions, and variables and variable values can be coupled to a means for driving a display 960 that is configured to convert the values to the signal format used in driving a display output. The output of the means for driving a display 960 can be coupled to a means for display 962 that is configured to display the data.

A means for processing 934 can be configured as an overall controller for the different modules in the audio filter tuning apparatus 900. In some embodiments, the means for processing 934 accesses and executes code stored as one or more instructions in the means for storage 930 to perform one or more functions related to each of the modules within the audio filter tuning apparatus 900.

The methods and apparatus described herein facilitate convenient, low cost, quick characterization of properties of an electronic device and reconfiguration of one or more parameters within the electronic device that affect the characterized properties. In one embodiment, the electronic device can be a mobile telephone, and the property of the electronic device that is characterized and reconfigured is the audio frequency response.

The audio frequency response can be modified by varying or otherwise reconfiguring the filter coefficients for a filter within the audio signal processing path within the electronic device. As an example, the filter coefficients for an FIR filter within the audio signal processing path of a mobile phone may be determined and programmed into the mobile phone to compensate an audio frequency response.

As used herein, the term coupled or connected is used to mean an indirect coupling as well as a direct coupling or connection. Where two or more blocks, modules, devices, or apparatus are coupled, there may be one or more intervening blocks between the two coupled blocks.

The various illustrative logical blocks, modules, and circuits described in connection with the embodiments disclosed herein may be implemented or performed with a general purpose processor, a digital signal processor (DSP), a Reduced Instruction Set Computer (RISC) processor, an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

Various embodiments have been described. These and other embodiments are within the scope of the following claims.

What is claimed is:

1. An apparatus for filter path tuning in an electronic device, the apparatus comprising:
    a signal generator coupled to the electronic device and configured to generate a frequency sweep of a signal processing signal path within the electronic device;
    a signal sampler configured to sample an output of the signal processing signal path and capture an initial frequency response;
    a user interface configured to accept a user selection of at least one band within the frequency sweep and variable values within each of the at least one band; and
    a coefficient module configured to determine a value for at least one reconfigurable parameter within the signal processing signal path within the electronic device based on the at least one band and the variable values within each of the at least one band.

2. The apparatus of claim 1, further comprising a device programmer coupled to the coefficient module and configured to modify the value of the reconfigurable parameter within the signal processing signal path within the electronic device via a control input on the electronic device.

3. The apparatus of claim 1, further comprising a frequency response mask module coupled to the user interface and configured to store data defining at least one predetermined frequency mask.

4. The apparatus of claim 1, further comprising a band control module coupled to the user interface and configured to accept user input defining a plurality of distinct bands.

5. The apparatus of claim 1, further comprising a parameter control module coupled to the user interface and configured to accept user input for each of the variable values.

6. The apparatus of claim 1, further comprising a processor configured to determine a simulated frequency response of the electronic device based on the value for at least one reconfigurable parameter determined by the coefficient module.

7. The apparatus of claim 1, further comprising a display configured to display the initial frequency response, a selected frequency mask, and a simulated frequency response of the electronic device based on the value for at least one reconfigurable parameter determined by the coefficient module.

8. The apparatus of claim 1, wherein the signal generator is configured to generate the frequency sweep across an audio band.

9. The apparatus of claim 1, wherein the signal sampler is configured to sample the output of the signal processing signal to capture the initial frequency response with the at least one reconfigurable parameter within the signal processing signal path within the electronic device configured to an initial value.

10. The apparatus of claim 1, wherein the variable values within each of the at least one band comprise a band gain and a weighting factor.

11. The apparatus of claim 1, wherein the at least one reconfigurable parameter comprises filter coefficients for a digital filter within the audio path of the electronic device.

12. An apparatus for filter path tuning in a mobile telephone, the apparatus comprising:
    a signal generator coupled to an input port of the mobile telephone and configured to generate a frequency sweep of an audio signal processing signal path within the mobile telephone across at least an audio frequency band;
    a signal sampler configured to sample an audio signal from the mobile telephone to capture an initial frequency response;
    a frequency response mask module configured to store data defining at least one predetermined frequency mask;
    a band control module configured to accept a user input defining a plurality of bands within the frequency sweep;
    a parameter control module configured to accept a user input for each of a plurality of variable values within each of the plurality of bands within the frequency sweep;
    a user interface configured to accept a user selection of a frequency mask and a user input of the variable values; and
    a coefficient module configured to determine filter coefficients for a digital filter within the audio signal processing path of the mobile telephone based on the plurality of bands and variable values.

13. The apparatus of claim 12, further comprising a processor configured to determine a simulated frequency response of the mobile phone based on the coefficient values determined by the coefficient module.

14. The apparatus of claim 12, wherein the coefficient module is configured to convert the filter coefficients to a number format used by the mobile telephone.

15. A method of filter path tuning in an electronic device, the method comprising:
   generating a frequency sweep from a signal processing path within the electronic device with the electronic device configured to an initial configuration;
   capturing an initial frequency response from the electronic device with the electronic device configured to the initial configuration;
   receiving a user selection of a selected frequency mask from a plurality of predetermined frequency masks;
   receiving a user input defining a plurality of bands within the frequency sweep;
   receiving a user input of a value of at least one variable within each of the plurality of bands within the frequency sweep; and
   determining filter coefficients for the signal processing signal path within the electronic device based on the plurality of bands and the value of the at least one variable within each of the plurality of bands.

16. The method of claim 15, further comprising:
   generating a simulated frequency response based on the filter coefficients; and
   displaying the initial frequency response, simulated frequency response, and selected frequency mask.

17. The method of claim 15, further comprising reconfiguring the electronic device with the filter coefficients.

18. The method of claim 15, further comprising initially configuring the electronic device with initial filter coefficients prior to capturing the initial frequency response.

19. The method of claim 18, wherein the initial filter coefficients configure a filter within the electronic device to provide substantially an all-pass response.

20. The method of claim 15, wherein capturing the initial frequency response from the electronic device comprises capturing an audio frequency response of a mobile telephone with the mobile telephone configured with initial filter coefficients.

21. The method of claim 15, wherein receiving a user input of a value of at least one variable comprises:
   receiving a user input for a band gain; and
   receiving a user input for a weighting factor.

22. The method of claim 15, wherein determining filter coefficients for the signal processing signal path within the electronic device comprises determining filter coefficients for a digital filter within an audio signal processing path of a mobile telephone.

23. An apparatus for filter path tuning in a mobile telephone, comprising:
   signal generator means for generating a frequency sweep of an audio signal processing signal path within the mobile telephone across at least an audio frequency band, the signal generator means being coupled to an input port of the mobile telephone;
   signal sampler means for sampling an audio signal from the mobile telephone to capture an initial frequency response;
   means for storing data defining at least one predetermined frequency mask;
   means for accepting a user input defining a plurality of bands within the frequency sweep;
   means for accepting a user input of a plurality of variable values within each of the plurality of bands within the frequency sweep;
   means for accepting a user selection of a frequency mask; and
   means for determining filter coefficients for a digital filter within the audio signal processing path of the mobile telephone based on the plurality of bands and variable values.

24. The apparatus of claim 23, further comprising means for determining a simulated frequency response of the mobile phone based on the filter coefficients determined by the means for determining filter coefficients.

25. The apparatus of claim 23, wherein the means for determining filter coefficients further comprises means for converting the filter coefficients to a number format used by the mobile telephone.

26. A method for filter path tuning in a mobile telephone, comprising:
   generating a frequency sweep of an audio signal processing signal path within the mobile telephone across at least an audio frequency band in a signal generator coupled to an input port of the mobile telephone;
   sampling an audio signal from the mobile telephone to capture an initial frequency response;
   storing data defining at least one predetermined frequency mask in a memory;
   accepting a user input defining a plurality of bands within the frequency sweep;
   accepting a user input of a plurality of variable values within each of the plurality of bands within the frequency sweep;
   accepting a user selection of a frequency mask; and
   determining filter coefficients for a digital filter within the audio signal processing path of the mobile telephone based on the plurality of bands and variable values.

27. The method of claim 26, further comprising determining a simulated frequency response of the mobile phone based on the determined filter coefficients.

28. The method of claim 26, wherein the determining filter coefficients for a digital filter further comprises converting the filter coefficients to a number format used by the mobile telephone.

29. A non-transitory processor-readable medium having stored thereon processor-executable instructions configured to cause a filter path tuning apparatus processor to perform operations comprising:
   generating a signal in a signal generator coupled to an input port of a mobile telephone and configured to generate a frequency sweep of an audio signal processing signal path within the mobile telephone across at least an audio frequency band;
   sampling an audio signal from the mobile telephone to capture an initial frequency response;
   storing data defining at least one predetermined frequency mask in a memory;
   accepting user input defining a plurality of bands within the frequency sweep;
   accepting user input of a plurality of variable values within each of the plurality of bands within the frequency sweep;
   accepting user selection of a frequency mask; and
   determining filter coefficients for a digital filter within the audio signal processing path of the mobile telephone based on the plurality of bands and variable values.

30. The non-transitory processor-readable medium of claim 29, wherein the stored processor-executable instructions are configured to cause a filter path tuning apparatus processor to perform operations further comprising determining a simulated frequency response of the mobile phone based on the determined filter coefficients.

31. The non-transitory processor-readable medium of claim 29, wherein the stored processor-executable instructions are configured to cause a filter path tuning apparatus processor to perform operations such that determining filter coefficients for a digital filter further comprises converting the filter coefficients to a number format used by the mobile telephone.

32. An apparatus for filter path tuning in an electronic device, comprising:
  means for generating a frequency sweep from a signal processing signal path within the electronic device with the electronic device configured to an initial configuration;
  means for capturing an initial frequency response from the electronic device with the electronic device configured to the initial configuration;
  means for receiving a user selection of a selected frequency mask from a plurality of predetermined frequency masks;
  means for receiving a user input defining a plurality of bands within the frequency sweep;
  means for receiving a user input of a value of at least one variable within each of the plurality of bands within the frequency sweep; and
  means for determining filter coefficients for the signal processing signal path within the electronic device based on the plurality of bands and the value of the at least one variable within each of the plurality of bands.

33. The apparatus of claim 32, further comprising:
  means for generating a simulated frequency response based on the filter coefficients; and
  means for displaying the initial frequency response, simulated frequency response, and selected frequency mask.

34. The apparatus of claim 32, further comprising means for reconfiguring the electronic device with the filter coefficients.

35. The apparatus of claim 32, further comprising means for initially configuring the electronic device with initial filter coefficients prior to capturing the initial frequency response.

36. The apparatus of claim 35, wherein the initial filter coefficients configure a filter within the electronic device to provide substantially an all-pass response.

37. The apparatus of claim 32, wherein means for capturing the initial frequency response from the electronic device comprises means for capturing an audio frequency response of a mobile telephone with the mobile telephone configured with initial filter coefficients.

38. The apparatus of claim 32, wherein means for receiving a user input of a value of at least one variable comprises:
  means for receiving a user input for a band gain; and
  means for receiving a user input for a weighting factor.

39. The apparatus of claim 32, wherein means for determining filter coefficients the signal processing signal path within the electronic device comprises means for determining filter coefficients for a digital filter within an audio signal processing path of a mobile telephone.

40. A non-transitory processor-readable medium having stored thereon processor-executable instructions configured to cause a filter path tuning apparatus processor to perform operations comprising:
  generating a frequency sweep from a signal processing signal path within an electronic device configured to an initial configuration;
  capturing an initial frequency response from the electronic device with the electronic device configured to the initial configuration;
  receiving a user selection of a selected frequency mask from a plurality of predetermined frequency masks;
  receiving a user input defining a plurality of bands within the frequency sweep;
  receiving a user input of a value of at least one variable within each of the plurality of bands within the frequency sweep; and
  determining filter coefficients for the signal processing signal path within the electronic device based on the plurality of bands and the value of the at least one variable within each of the plurality of bands.

41. The non-transitory processor-readable medium of claim 40, wherein the stored processor-executable instructions are configured to cause a filter path tuning apparatus processor to perform operations further comprising:
  generating a simulated frequency response based on the filter coefficients; and
  displaying the initial frequency response, simulated frequency response, and selected frequency mask.

42. The non-transitory processor-readable medium of claim 40, wherein the stored processor-executable instructions are configured to cause a filter path tuning apparatus processor to perform operations further comprising reconfiguring the electronic device with the filter coefficients.

43. The non-transitory processor-readable medium of claim 40, wherein the stored processor-executable instructions are configured to cause a filter path tuning apparatus processor to perform operations further comprising initially configuring the electronic device with initial filter coefficients prior to capturing the initial frequency response.

44. The non-transitory processor-readable medium of claim 43, wherein the stored processor-executable instructions are configured to cause a filter path tuning apparatus processor to perform operations such that the initial filter coefficients configure a filter within the electronic device to provide substantially an all-pass response.

45. The non-transitory processor-readable medium of claim 40, wherein the stored processor-executable instructions are configured to cause a filter path tuning apparatus processor to perform operations such that capturing the initial frequency response from the electronic device comprises capturing an audio frequency response of a mobile telephone with the mobile telephone configured with initial filter coefficients.

46. The non-transitory processor-readable medium of claim 40, wherein the stored processor-executable instructions are configured to cause a filter path tuning apparatus processor to perform operations such that receiving a user input of a value of at least one variable comprises:
  receiving a user input for a band gain; and
  receiving a user input for a weighting factor.

47. The non-transitory processor-readable medium of claim 40, wherein the stored processor-executable instructions are configured to cause a filter path tuning apparatus processor to perform operations such that determining filter coefficients for the signal processing signal path within the electronic device comprises determining filter coefficients for a digital filter within an audio signal processing path of a mobile telephone.

\* \* \* \* \*